(12) United States Patent
Hong et al.

(10) Patent No.: US 9,451,725 B2
(45) Date of Patent: Sep. 20, 2016

(54) COMMUNICATIONS PRODUCT AND BASE STATION SYSTEM

(71) Applicant: Huawei Technologies Co., Ltd., Shenzhen (CN)

(72) Inventors: Yuping Hong, Shenzhen (CN); Chenglong Wang, Shenzhen (CN); Mingliang Hao, Shenzhen (CN); Youhe Ke, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/828,321

(22) Filed: Aug. 17, 2015

(65) Prior Publication Data

US 2016/0057888 A1 Feb. 25, 2016

(30) Foreign Application Priority Data

Aug. 19, 2014 (CN) .......................... 2014 1 0411568

(51) Int. Cl.
*H05K 7/20* (2006.01)
*H04B 1/036* (2006.01)

(52) U.S. Cl.
CPC .......... *H05K 7/20145* (2013.01); *H04B 1/036* (2013.01); *H05K 7/20572* (2013.01)

(58) Field of Classification Search
CPC .......................... H04B 1/036; H05K 7/20145
See application file for complete search history.

(56) References Cited

U.S. PATENT DOCUMENTS

| | | | |
|---|---|---|---|
| 5,689,403 A | 11/1997 | Robertson, Jr. et al. | |
| 2007/0177552 A1* | 8/2007 | Wu | H04W 88/08 370/335 |
| 2012/0206885 A1* | 8/2012 | Pan | H04B 1/38 361/737 |
| 2013/0299125 A1 | 11/2013 | Shi et al. | |
| 2014/0138069 A1* | 5/2014 | Hao | H05K 7/20554 165/121 |
| 2015/0047823 A1* | 2/2015 | Zhang | H05K 7/207 165/200 |

FOREIGN PATENT DOCUMENTS

| | | |
|---|---|---|
| CN | 104780743 A | 7/2015 |
| EP | 2760262 A1 | 7/2014 |

OTHER PUBLICATIONS

Foreign Communication From a Counterpart Application, European Application No. 15002464.4, Extended European Search Report dated Jan. 7, 2016, 6 pages.
Partial English Translation and Abstract of Chinese Patent Application No. CN104780743, Nov. 30, 2015, 4 pages.

* cited by examiner

*Primary Examiner* — Kashif Siddiqui
(74) *Attorney, Agent, or Firm* — Conley Rose, P.C.; Grant Rodolph

(57) ABSTRACT

A communications product, including at least one RRU and a fan assembly, where the fan assembly is independent of the at least one RRU, and is disposed side by side with the at least one RRU, an air duct is disposed between the fan assembly and the RRU, and an airflow passes, from the fan assembly, through the air duct, and arrives at the at least one RRU, to dissipate heat of the at least one RRU. The communications product of the present disclosure can ensure a heat-dissipation capability, and also can allow the RRU to be small in size. The present disclosure further provides a base station system that includes the communications product.

18 Claims, 8 Drawing Sheets

COMMUNICATIONS PRODUCT AND BASE STATION SYSTEM

CROSS-REFERENCE TO RELATED APPLICATION

This application claims priority to Chinese Patent Application No. 201410411568.2, filed on Aug. 19, 2014, which is hereby incorporated by reference in its entirety.

TECHNICAL FIELD

The present disclosure relates to a communications product of a base station system, and in particular, to a heat-dissipation architecture of the communications product.

BACKGROUND

A remote radio unit (RRU) is a distributed network coverage mode, which places large-capacity macro cell base stations together in an attainable central equipment room, processes all baseband portions, pulls radio frequency modules in the base stations to the RRU by using optical fibers, and separately places the radio frequency modules in sites determined in network planning, thereby saving a large number of equipment rooms needed by a conventional solution.

Due to the foregoing advantages of the RRU, the RRU has been widely applied. When the RRU is mounted close to an antenna, considering a load capacity, a wind resistance, and construction costs of a mounting pole, an operator hopes that the RRU is as small in size and as light in weight as possible. Therefore, a requirement for miniaturizing the RRU persists. In the industry at an early stage, the RRU has a small output power and a low overall heat consumption, and an RRU of a specific size dissipates heat naturally, and dissipates heat of the radio frequency modules by relying on natural convection. As the output power of the RRU increases, the heat consumption of the RRU module also increases, and a requirement for heat dissipation is increasingly higher.

The RRU is securely connected to a mounting assembly, and the RRU is secured to the mounting pole close to the antenna by using the mounting assembly. The RRU uses an air cooling heat-dissipation mode, and one fan assembly is externally mounted on a single RRU device to dissipate heat of the RRU device. The fan assembly is used to dissipate heat of the single RRU, and the external fan assembly increases the size of the single RRU, which does not facilitate miniaturization development of a product.

Therefore, how to design a communications product that includes the RRU and an RRU heat-dissipation architecture to ensure the heat-dissipation of the RRU and further ensure size miniaturization of the RRU is a subject that is studied in the industry all the time.

SUMMARY

A technical problem to be resolved by the present disclosure is to provide a communications product that includes a RRU, which not only can ensure heat dissipation of the RRU, but also facilitates size miniaturization design of an RRU product.

To achieve the foregoing objective, implementation manners of the present disclosure provide the following technical solutions According to one aspect, the present disclosure provides a communications product, where the communications product includes at least one RRU and a fan assembly, where the fan assembly is independent of the at least one RRU and is disposed side by side with the at least one RRU, an air duct is disposed between the fan assembly and the RRU, and an airflow passes, from the fan assembly, through the air duct, and arrives at the at least one RRU, to dissipate heat of the at least one RRU.

In a first possible implementation manner, the RRU includes a front end plate, a back end plate, a remote radio main body, and multiple heat-dissipation fins, where the remote radio main body is connected between the front end plate and the back end plate, the multiple heat-dissipation fins are located between the front end plate and the back end plate and saliently disposed on the remote radio main body, and the fan assembly directly faces a side of the heat-dissipation fins.

With reference to the first possible implementation manner, in a second possible implementation manner, the communications product further includes a mounting assembly, where the mounting assembly is located at a side of the back end plate of the RRU, the mounting assembly includes a securing part and a ventilation part that is securely connected to the securing part, the securing part is securely connected to the RRU and the fan assembly, the air duct is formed inside the ventilation part, the ventilation part includes at least two openings, a first air vent is disposed on the back end plate of the RRU, a second air vent is disposed on a surface, which faces the mounting assembly, of the fan assembly, the at least two openings correspond one-to-one to the at least one RRU and the fan assembly, and the at least two openings are respectively connected to the first air vent and the second air vent.

With reference to the second possible implementation manner, in a third possible implementation manner, the fan assembly includes a front end surface and a back end surface, the second air vent is disposed on the back end surface, multiple ventilation openings are distributed on the front end surface, and the airflow forms convection inside the fan assembly through the ventilation openings and the second air vent.

With reference to the third possible implementation manner, in a fourth possible implementation manner, the front end surface is coplanar with the front end plate of the RRU, and the back end surface is coplanar with the back end plate of the RRU.

With reference to the second possible implementation manner, in a fifth possible implementation manner, the ventilation part is located right below or right above the securing part.

With reference to the fifth possible implementation manner, in a sixth possible implementation manner, the securing part includes at least two sub-securing parts that are mutually spliced into a single-row structure, and the ventilation part includes at least two sub-ventilation parts that are mutually spliced into a single-row structure, where the at least two sub-securing parts and the at least two sub-ventilation parts correspond one-to-one to each other to jointly form a double-row structure, the at least two sub-ventilation parts internally communicate with each other, and the at least two openings are respectively disposed on the at least two sub-ventilation parts.

With reference to the second possible implementation manner, in a seventh possible implementation manner, the multiple heat-dissipation fins are distributed on two sides of the remote radio main body, and connection of the first air vent and the opening makes the air duct communicate with all heat-dissipation fins on the two sides of the remote radio main body.

With reference to the second possible implementation manner, in an eighth possible implementation manner, there are multiple RRUs, the fan assembly is located on a side of the multiple RRUs or located between two of the multiple RRUs.

With reference to the second possible implementation manner, in a ninth possible implementation manner, the RRU and the fan assembly are superimposed over each other to form two rows of communications components, the mounting assembly is located between the two rows of communications components, and the two rows of communications components share the air duct.

With reference to the ninth possible implementation manner, in a tenth possible implementation manner, the back end plate of the RRU in one row of the communications components faces the back end plate of the RRU in the other row of the communications components.

With reference to the tenth possible implementation manner, in an eleventh possible implementation manner, the air duct is a straight channel, the openings are distributed on two sides of the air duct, the openings located on one side of the air duct communicate with one row of the communications components, and the openings located on the other side of the air duct communicate with the other row of the communications components.

With reference to one of the first to the eleventh possible implementation manners, in a twelfth possible implementation manner, the RRU further includes an air deflection structure, where the air deflection structure communicates with the air duct, the air deflection structure is surrounded by the heat-dissipation fins, and the airflow from the air duct passes through the air deflection structure and then is transferred to the heat-dissipation fins.

With reference to the twelfth possible implementation manner, in a thirteenth possible implementation manner, the air deflection structure includes an air deflection cover plate and multiple air deflection pillars, an air deflection cavity is enclosed jointly by the multiple heat-dissipation fins and the remote radio main body, the multiple air deflection pillars extend from a side of the remote radio main body, and are distributed inside the air deflection cavity, the air deflection cover plate covers the tops of the multiple air deflection pillars, and shields the air deflection cavity, and the airflow enters the air deflection cavity, and is distributed by the air deflection pillars into the multiple heat-dissipation fins.

With reference to the twelfth possible implementation manner, in a fourteenth possible implementation manner, the heat-dissipation fins and the remote radio main body jointly form a receptacle, the air deflection structure includes an air deflection cover plate and multiple air deflectors, multiple air deflection channels are formed inside the receptacle by using the multiple air deflectors, the air deflection cover plate is secured to the remote radio main body and shields the receptacle, and the airflow enters the receptacle, and is distributed by the air deflection channels between the multiple air deflectors into the heat-dissipation fins.

With reference to one of the twelfth to the fourteenth possible implementation manners, in a fifteenth possible implementation manner, the air deflection structure is adjacent to the back end plate.

According to another aspect, the present disclosure further provides a base station system, including an equipment room and an antenna, where a building baseband unit is disposed inside the equipment room, the base station system further includes the communications product in any one of the foregoing implementation manners, the RRU of the communications product is connected to the building baseband unit by using an optical fiber, the holder is close to the antenna, and the RRU is electrically connected to the antenna.

A fan assembly of a communications product provided by the present disclosure is independent of the RRU, and is disposed side by side with the RRU, where the fan assembly can be used to dissipate heat of the RRU, and a fan does not need to be externally mounted on the RRU any longer, so that the present disclosure facilitates size miniaturization of the RRU. Because the independent fan assembly can provide a stronger airflow, disposing the independent fan assembly side by side with the RRU also facilitates the heat dissipation of the RRU. Therefore, the present disclosure can ensure a heat-dissipation capability of the communications product, and also can facilitate size miniaturization of the RRU of the communications product.

BRIEF DESCRIPTION OF DRAWINGS

To describe the technical solutions in the present disclosure more clearly, the following briefly introduces the accompanying drawings required for describing the implementation manners. The accompanying drawings in the following description show merely some implementation manners of the present disclosure, and a person of ordinary skill in the art may still derive other drawings from these accompanying drawings without creative efforts.

DESCRIPTION OF EMBODIMENTS

The following clearly describes the technical solutions in the implementation manners of the present disclosure with reference to the accompanying drawings in the implementation manners of the present disclosure.

Figure 1:
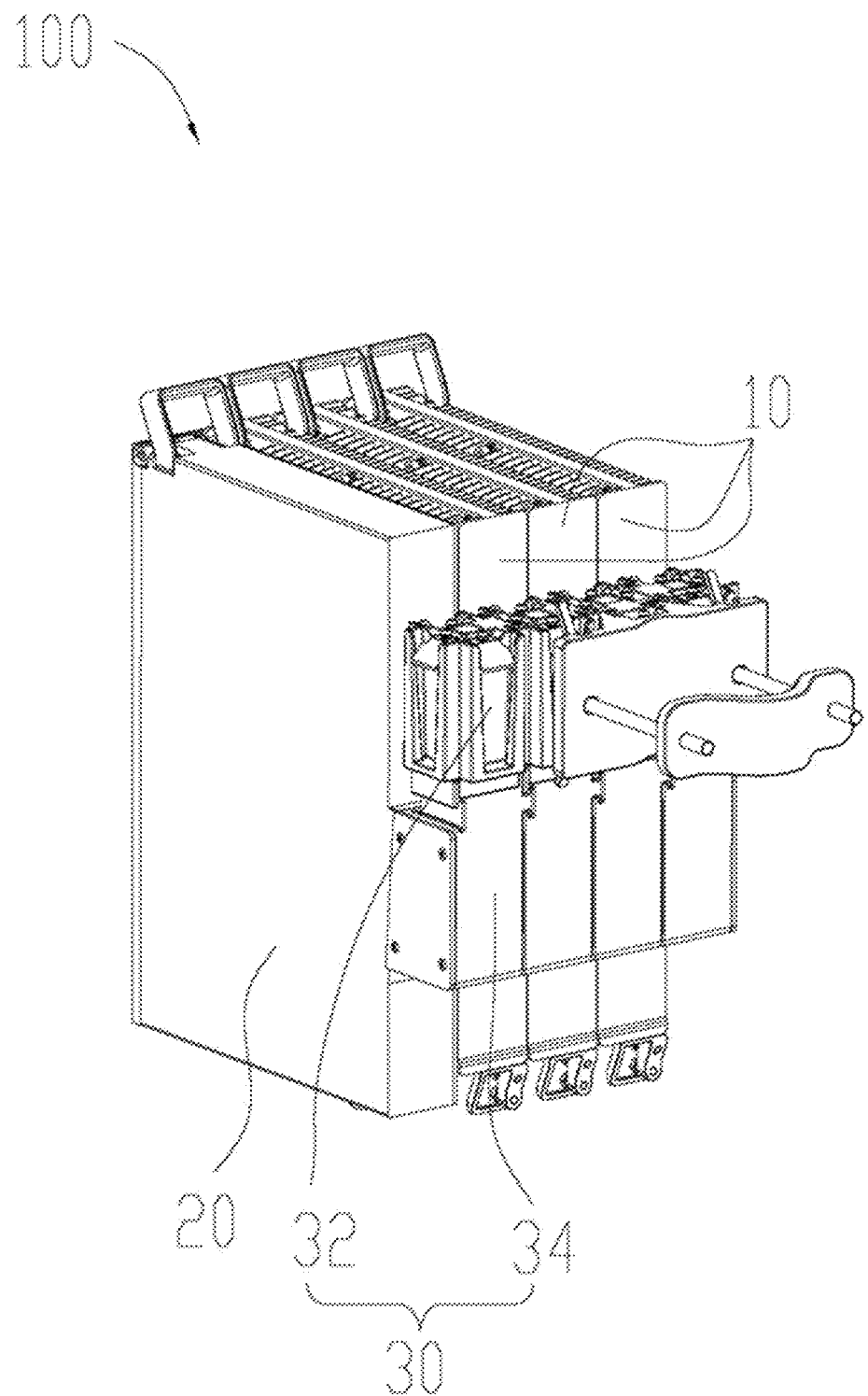
FIG. 1 is a schematic three-dimensional diagram of a communications product according to an implementation manner of the present disclosure.
Figure 2:
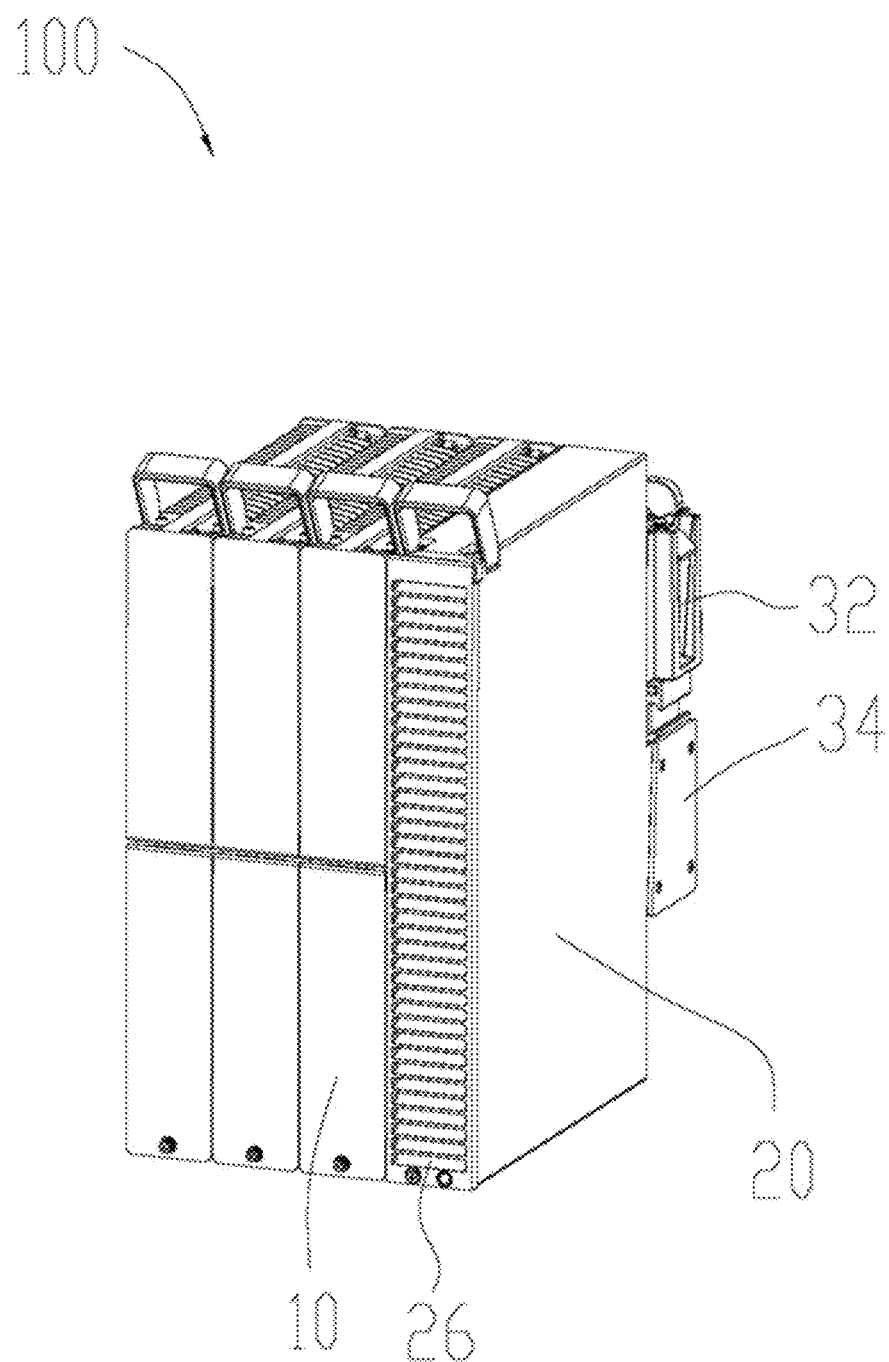
FIG. 2 is a schematic three-dimensional diagram of a communications product in another direction according to an implementation manner of the present disclosure.

Referring to FIG. 1 and FIG. 2, the present disclosure relates to a communications product 100, which is applied to an outdoor base station system. Generally the communications product 100 includes at least one RRURRU 10 and a fan assembly 20. The fan assembly 20 is configured to provide an air source for heat dissipation of the RRU 10, the fan assembly 20 is independent of the at least one RRU 10, and is disposed side by side with the at least one RRU 10, an air duct is disposed between the fan assembly 20 and the RRU 10, and an airflow passes, from the fan assembly 20, through the air duct, and arrives at the at least one RRU 10, to dissipate heat of the at least one RRU 10.

In the present disclosure, the fan assembly is independent of the RRU, and is disposed side by side with the at least one RRU; in this way, a fan or a heat-dissipation component does not need to be externally mounted on the RRU, so that the RRU can be miniaturized; because the independent fan assembly can provide a stronger airflow, disposing the independent fan assembly side by side with the RRU also facilitates the heat dissipation of the RRU.

In addition, the RRU 10 of the present disclosure may use a fan assembly 20 of any specification. If a heat-dissipation capability of the communications product 100 needs to be improved, a high-power fan assembly 20 may be used instead; and if the heat-dissipation capability does not need to be excessively high, a low-power fan assembly 20 may be used instead. Therefore, the present disclosure helps improve the heat-dissipation capability of the communications product 100, and is further environmentally friendly.

In an implementation manner, one fan assembly 20 is used to dissipate heat of one RRU 10, and an air duct is disposed at a connecting place at which the fan assembly 20 is connected to the RRU 10. For example, one side, at which an air vent is disposed, of the fan assembly is adhered to one side of the RRU, so that an airflow coming out of the fan assembly 20 is directly used to dissipate heat of the RRU 10. In another implementation manner, one fan assembly 20 may also be used to dissipate heat of multiple RRUs 10; and an air duct is disposed on the periphery of the multiple RRUs 10, to separately transfer the airflow, which is provided by the fan assembly 20, to the RRUs 10.

Figure 6:
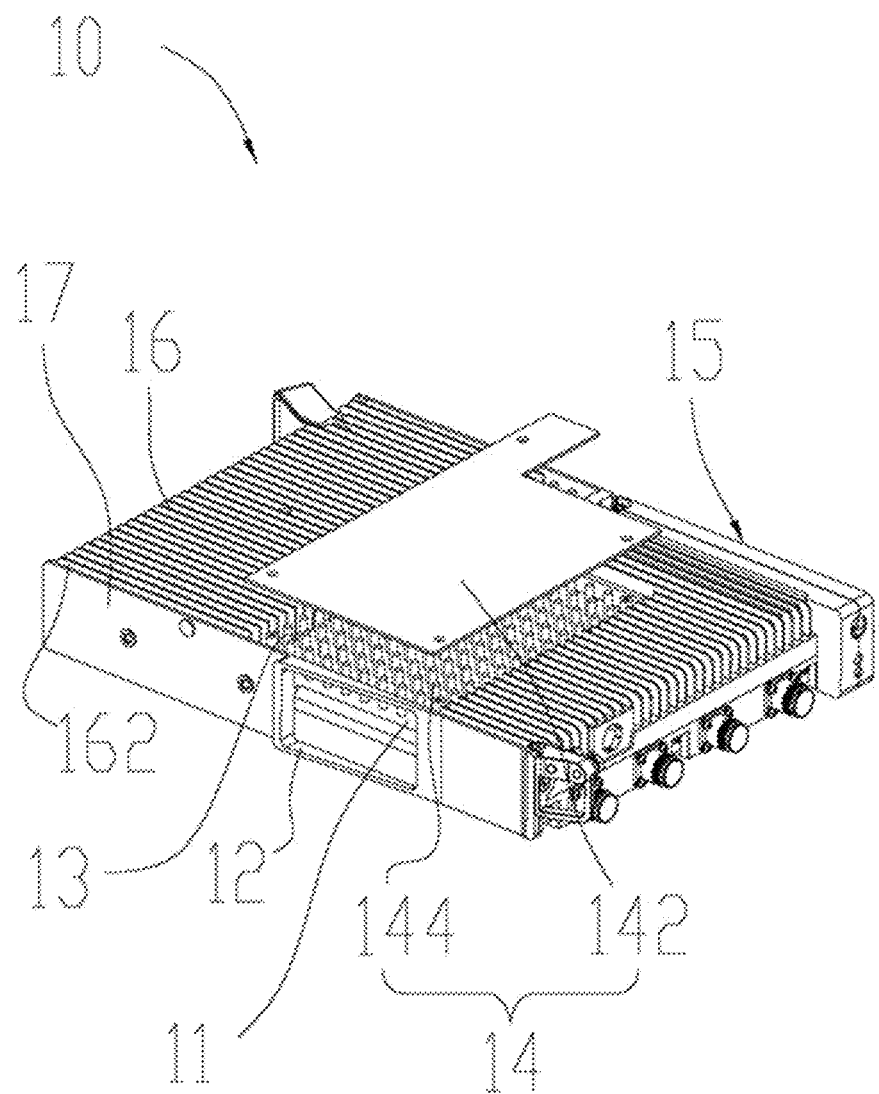
FIG. 6 is a schematic three-dimensional diagram of a RRU of a communications product according to an implementation manner of the present disclosure.

Referring to FIG. 6, the RRU 10 includes a front end plate 15, a back end plate 17, a remote radio main body 11, and multiple heat-dissipation fins 16, where the remote radio main body 11 is connected between the front end plate 15 and the back end plate 17, the multiple heat-dissipation fins 16 are located between the front end plate 15 and the back end plate 17 and saliently disposed on the remote radio main body 11, and the fan assembly 20 directly faces a side of the heat-dissipation fins 16. By means of disposition of the multiple heat-dissipation fins 16 that are disposed between the front end plate 15 and the back end plate 17 and saliently disposed on the remote radio main body 11, when the airflow arrives at the RRU 10, the airflow is distributed to the multiple heat-dissipation fins 16, and the multiple heat-dissipation fins 16 increase a heat-dissipation area of an outer surface of the remote radio main body 11, which facilitates dissipation of more heat.

Figure 3:
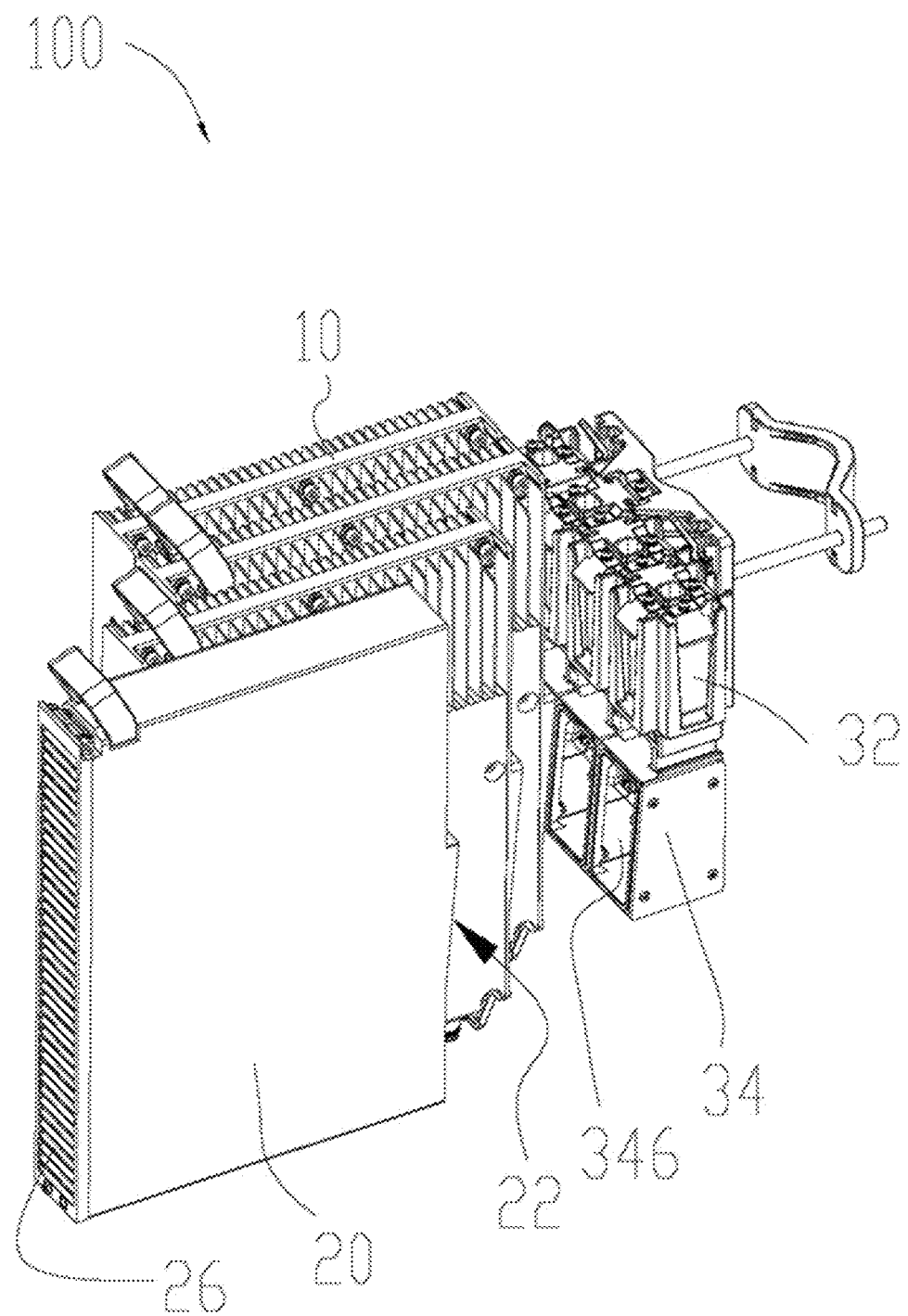
FIG. 3 is a schematic three-dimensional exploded diagram of a communications product according to an implementation manner of the present disclosure.

Referring to FIG. 1, in this implementation manner, the communications product 100 further includes a mounting assembly 30, where the mounting assembly 30 is configured to mount the RRU 10 and the fan assembly 20 to a holder (not shown in the figure), and usually mount them to a mounting pole or a wall surface close to the antenna. The mounting assembly 30 is located on a side of the back end plate 17 of the RRU 10, the mounting assembly 30 includes a securing part 32 and a ventilation part 34 that is securely connected to the securing part 32, the securing part 32 is securely connected to the RRU 10 and the fan assembly 20, and the RRU 10 and the fan assembly 20 are mounted to the holder (not shown in the figure) by using the securing part 32. Referring to FIG. 3, an air duct 346 is formed inside the ventilation part 34; referring to FIG. 4, the ventilation part 34 includes at least two openings 344; referring to FIG. 6, a first air vent 12 is disposed on the back end plate 17 of the RRU 10; and referring to FIG. 7, a second air vent 22 is disposed on a surface, which faces the mounting assembly 30, of the fan assembly 20, the at least two openings 344 correspond one-to-one to the at least one RRU 10 and the fan assembly 20, and the at least two openings 344 are respectively connected to the first air vent 12 and the second air vent 22. An airflow produced by an air source inside the fan assembly 20 enters the air duct 346 from the second air vent 22 and through the openings 344 that are connected to the second air vent 22, and then the airflow passes through other openings 344 that are connected to the first air vent 12, passes through the first air vent 12, and are transferred into multiple heat-dissipation fins 16 of the RRU 10, to perform air cooling heat-dissipation on the RRU 10. In this implementation manner, the ventilation part 34 is disposed on the mounting assembly, the air duct 346 is disposed inside the ventilation part 34, and a structure of the air duct 346 between the fan assembly 20 and the RRU 10 is disposed by using mounting space of the mounting assembly 30; in this way, on the basis that the fan assembly 20 and RRU 10 are superimposed side by side, an overall size miniaturization design is further ensured for the communications product 100.

Figure 7:
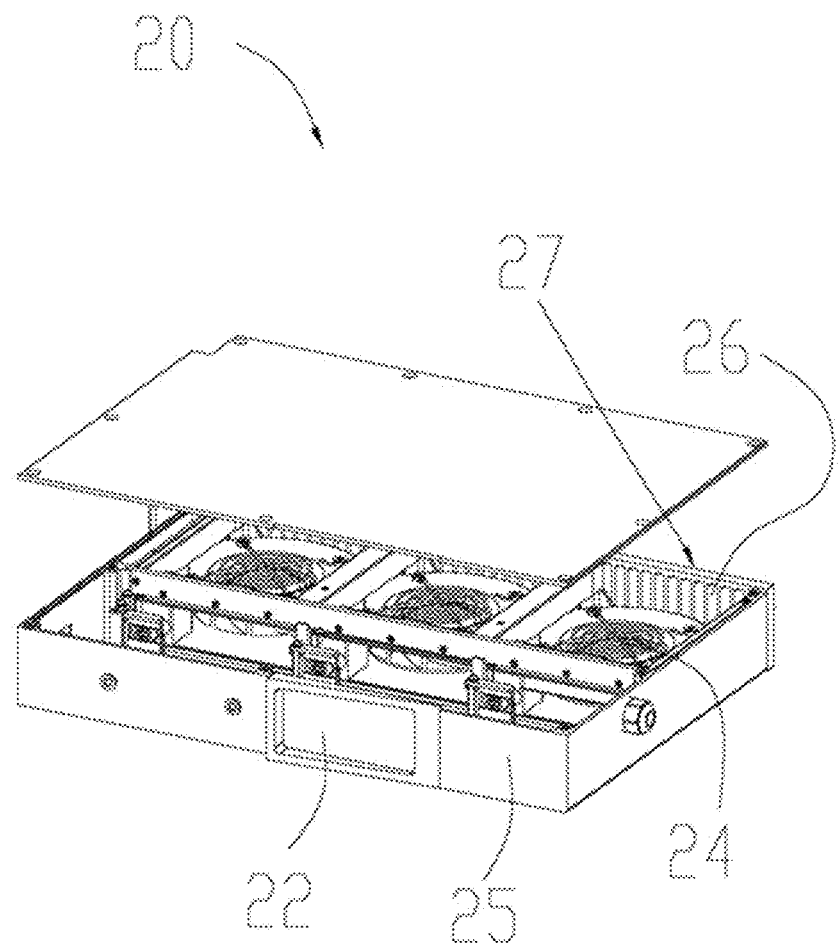
FIG. 7 is a schematic three-dimensional diagram of a fan assembly of a communications product according to an implementation manner of the present disclosure.

Further, referring to FIG. 7, the fan assembly includes a front end surface 25 and a back end surface 27, the second air vent 22 is disposed on the back end surface 27, multiple ventilation openings 26 are distributed on the front end surface 25, and the airflow forms convection inside the fan assembly 20 through the ventilation openings 26 and the second air vent 22, which can improve the ventilation and heat dissipation performance. An air supply source 24 is disposed inside the fan assembly, where the air supply source 24 is a blower such as a fan or a compressor. In this implementation manner, each ventilation opening is in a bar shape, and arranged in a cascading manner from the bottom up.

Further, the front end surface 25 is coplanar with the front end plate 15 of the RRU 10, and the back end surface 27 is coplanar with the back end plate 17 of the RRU 10. Such a design makes the fan assembly 20 and the RRU 10 roughly the same in shape and structure, thereby facilitating assembly of the fan assembly 20, the RRU 10 and the mounting assembly.

As shown in FIG. 1 to FIG. 4, in this implementation manner, the ventilation part 34 is located right below or right above the securing part 32. An up-and-down manner in which the ventilation part 34 and the securing part 32 are arranged facilitates size reduction of the entire mounting assembly; the ventilation part 34 and the securing part 32 are both straightly arranged, and the ventilation part 34 is connected to the securing part 32 to form a structure of two superimposed rows. In the present disclosure, the air duct 346 between the fan assembly 20 and the RRU 10 is disposed on the periphery of the fan assembly 20 and the RRU 10, and the structure of the air duct 346 can be easily disposed in idle space above and below the securing part 32.

Figure 4:
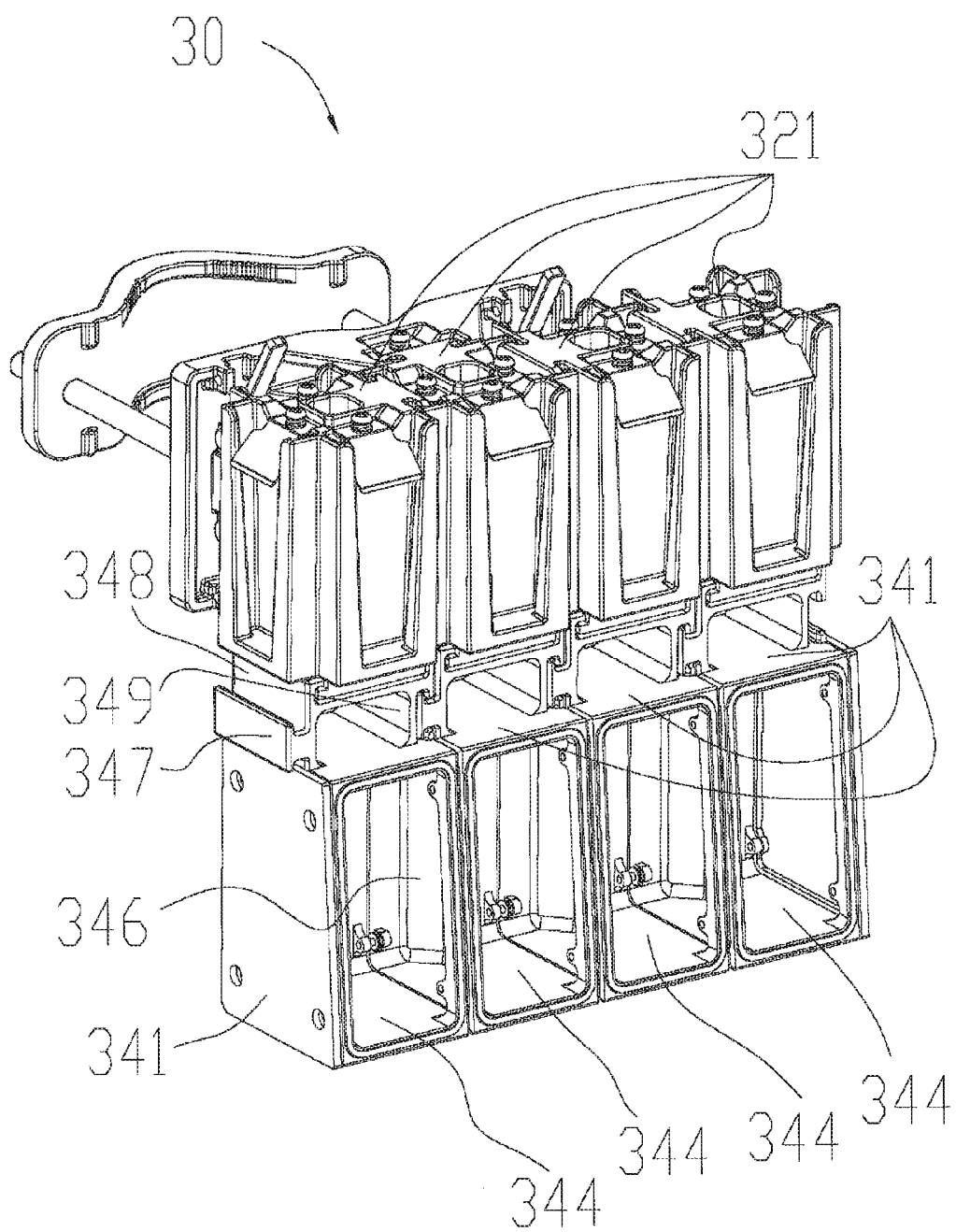
FIG. 4 is a schematic three-dimensional diagram of a mounting assembly of a communications product according to an implementation manner of the present disclosure.

Referring to FIG. 4, the securing part 32 includes at least two sub-securing parts 321 that are mutually spliced into a single-row structure, and the ventilation part 34 includes at least two sub-ventilation parts 341 that are mutually spliced into a single-row structure, where the at least two sub-securing parts 321 and the at least two sub-ventilation parts 341 correspond one-to-one to each other to jointly form a double-row structure, the at least two sub-ventilation parts 341 internally communicate with each other, and the at least two openings 344 are respectively disposed on the at least two sub-ventilation parts 341. In other words, a quantity of the at least two sub-ventilation parts 341 is equal to a sum of a quantity of the RRU 10 and a quantity of the fan assembly 20. Designs of the sub-securing parts 321 and the sub-ventilation parts 341 and the splicing connection manner enable the mounting assembly 30 to be flexibly applied, to assemble a needed quantity of the sub-ventilation parts 341 and the sub-securing parts 321 according to different use requirements.

Each sub-ventilation part 341 is in a three-way or two-way ventilation channel structure, to be assembled to the adjacent sub-ventilation part 341. The multiple sub-ventilation parts 341 can form air ducts 346 of different shapes by using multiple arrangement manners, for example, the multiple sub-ventilation parts 341 are arranged in a line to form a straight air duct 346, or the multiple sub-ventilation parts 341 are arranged in an L shape to form an L-shaped air duct 346; a specific arrangement form is determined according to available space around the communications product 100, to ensure that the space around the communications product 100 is effectively used, so that space is saved during mounting of the communications product 100.

In another implementation manner, the ventilation part 34 may also be in an integrated structure. With the integrated structure, a mounting process of the multiple sub-ventilation parts 341 is omitted, and the structure is simplified. Compared with the integrated structure, the ventilation part 34 that includes the multiple sub-ventilation parts 341 is more flexible, and may be combined and spliced according to a specific requirement. A specific structure of each sub-ventilation part 341 is as follows Referring to FIG. 5, each of the sub-ventilation parts 341 includes a first splicing part 347 and a second splicing part 349, and a disassemblable spliced structure is formed between two adjacent sub-ventilation parts 341 by fitting between the first splicing part 347 of one of the sub-ventilation parts 341 and the second splicing part 349 of the other of the sub-ventilation parts 341.

The first splicing part 347 and the second splicing part 349 are located on a same surface of the sub-ventilation part 341, the first splicing part 347 and the second splicing part 349 are respectively close to two opposite sides of the sub-ventilation part 341, the first splicing part 347 includes a first body 3472 and a slider 3474 that is saliently disposed on the first body 3472 and extends away from the second splicing part 349, the second splicing part 349 includes a second body 3492 and a stopping part 3494 that is disposed on a side, which is away from the first splicing part 347, of the second body 3492, a sliding slot 3496 is formed between the stopping part 3494 and the second body 3492, and two adjacent sub-ventilation parts 341 are spliced into a whole by fitting between the slider 3474 and the sliding slot 3496. In this implementation manner, to ensure assembly stability of the sub-ventilation parts 341, two adjacent sub-ventilation parts 341 are securely connected by using a screw or a fastener structure.

Figure 5:
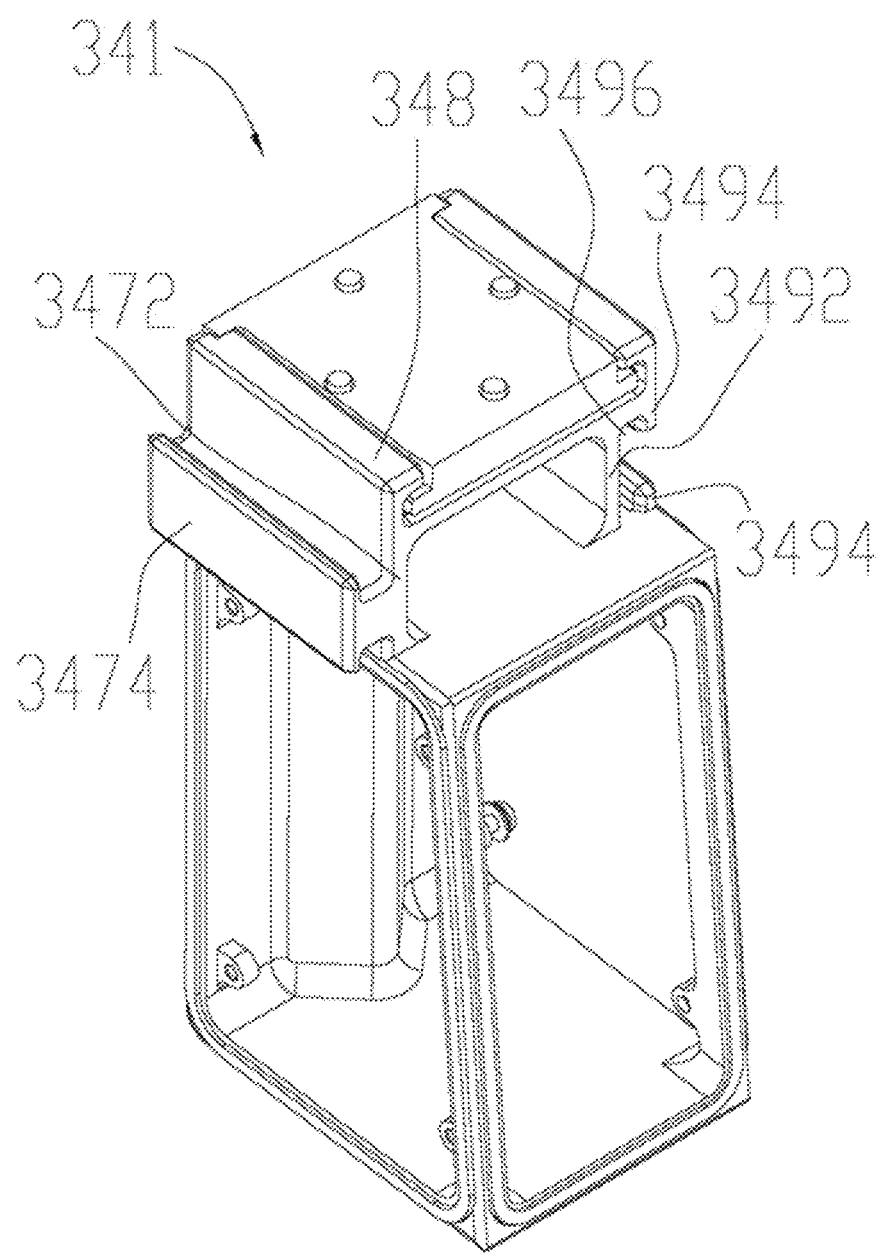
FIG. 5 is a schematic three-dimensional diagram of a sub-ventilation part of a mounting assembly of a communications product according to an implementation manner of the present disclosure.

Referring to FIG. 4 and FIG. 5, each of the sub-ventilation parts 341 further includes a third splicing part 348, where the third splicing part 348 is integrally formed between the first splicing part 347 and the second splicing part 349, and the third splicing part 348 is used to be connected to the sub-securing parts 321. The manner in which the third splicing part 348 and the sub-securing parts 321 are connected is the same as the manner in which two adjacent sub-ventilation parts 341 are spliced, and may also be implemented in a manner in which the slider 3474 is fitted to the sliding slot 3496. In this way, during assembly of the mounting assembly 30, a connection between the multiple sub-ventilation parts 341, a connection between the multiple sub-ventilation parts 341, a connection between the multiple sub-securing parts 321, and a connection between the sub-ventilation part 341 and the sub-securing part 321 may be implemented by using the same splicing manner, so that it is convenient and fast to implement assembly of the mounting assembly 30.

In the RRU 10, the multiple heat-dissipation fins 16 are distributed on two sides of the remote radio main body 11, the connection of the first air vent 12 and the opening 344 makes the air duct 346 communicate with all heat-dissipation fins 16 on the two sides of the remote radio main body 11. The remote radio main body 11 is surrounded by the front end plate 15, the back end plate 17, and the multiple heat-dissipation fins 16, which increases a heat-dissipation area. Metal plates with a good heat-dissipation capability may be selected and used as the front end plate 15 and the back end plate 17, so that the front end plate 15 and the back end plate 17 can assist in the heat dissipation.

An arrangement manner in which the fan assembly 20 and the RRU 10 are superimposed side by side in the present disclosure may have multiple variations. In an implementation manner, there are multiple RRUs 10, the fan assembly 20 is located on a side of the multiple RRUs 10 or is located between two of the multiple RRUs 10. If the fan assembly 20 is located on a side of the multiple RRUs 10, it is convenient to replace and detach the fan assembly 20. If the fan assembly 20 is located between two of the RRUs 10, that is, the fan assembly 20 is placed among the multiple RRUs 10, the airflow sent out by the fan assembly 20 can flow to the RRUs 10 along a short path quickly, which improves the heat-dissipation capability.

In an implementation manner, the RRU 10 and the fan assembly 20 are superimposed over each other to form two rows of communications components, the mounting assembly is located between the two rows of communications components, and the two rows of communications components share the air duct 346.

The back end plate 17 of the RRU 10 in one row of the communications components faces the back end plate 17 of the RRU 10 in the other row of the communications components. The air duct 346 is a straight channel, the openings 344 are distributed on two sides of the air duct 346, the openings 344 located on one side of the air duct 346 communicate with one row of the communications components, and the openings 344 located on the other side of the air duct communicate with the other row of the communications components.

The communications product 100 further provided by the present disclosure includes multiple RRUs 10, at least two fan assemblies 20, and a mounting assembly 30, where a structure of the mounting assembly 30 is the same as the foregoing, and is not repeated. The multiple RRUs 10 and the at least two fan assemblies 20 are superimposed over each other to form two rows of the communications components (which are not marked), the mounting assembly 30 are connected between the two rows of the communications components, the securing part 32 securely connects the two rows of the communications components, the air duct 346 is disposed inside the ventilation part 34 of the mounting assembly 30, and the air duct 346 is connected between the at least two fan assemblies 20 and the multiple RRUs 10, to make the airflow pass from the at least two fan assemblies 20, through the air duct 346, and into the multiple RRUs 10.

In an implementation manner, each row of the communications components includes at least one of the fan assemblies 20, and the multiple RRUs 10 are symmetrically distributed inside the two rows of the communications components.

In an implementation manner, in each row of the communications components, the RRUs 10 and the fan assemblies 20 are successively superimposed over each other and alternately arranged according to a predetermined rule. The predetermined rule may be construed as follows: for example, two RRUs 10, one fan assembly 20, two RRUs 10, one fan assembly 20, two RRUs 10 . . . and so on are successively arranged; or an arrangement manner is as follows: five RRUs 10, five fan assemblies 20, four RRUs 10, four fan assemblies 20, three RRUs 10, three fan assemblies 20 . . . and so on are successively arranged.

Figure 8:
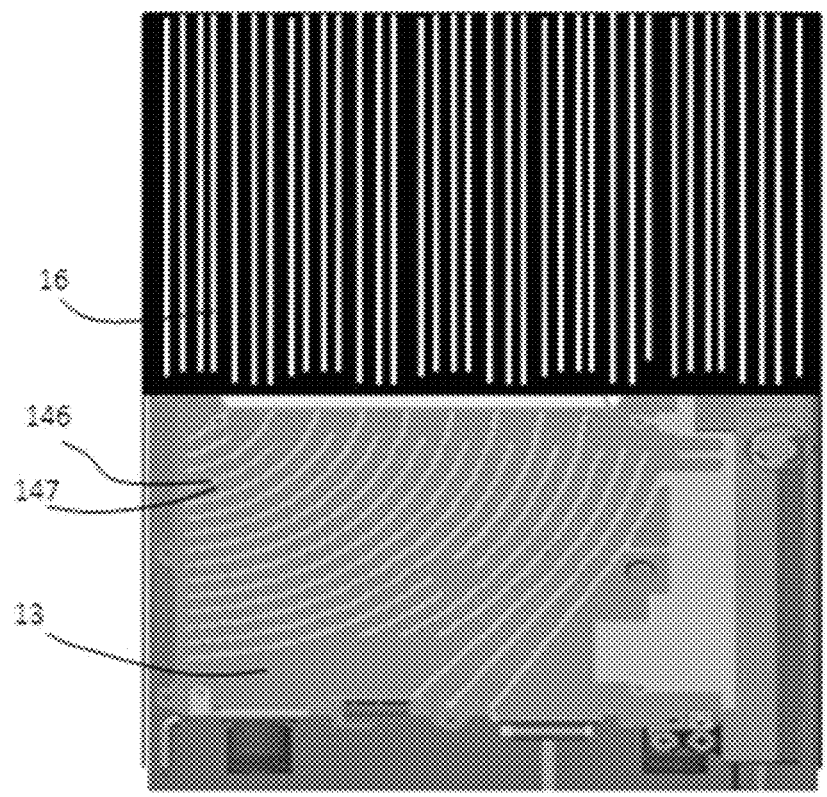
FIG. 8 is a schematic diagram of a RRU of a communications product according to an implementation manner of the present disclosure.

Referring to FIG. 6 and FIG. 8, the RRU 10 further includes an air deflection structure 14, where the air deflection structure 14 communicates with the air duct 346, and the air deflection structure 14 is surrounded by the heat-dissipation fins 16, and the airflow from the air duct 346 passes through the air deflection structure 14, and then is transferred to the heat-dissipation fins 16.

In this implementation manner, the heat-dissipation fins 16 include multiple sheet units 162 that are perpendicular to a surface of the remote radio main body 11 and are spaced in parallel with each other, where the sheet unit 162 may be in a flat plate structure, and may also be in a curved structure, for example, a single sheet unit 162 is S-shaped or C-shaped. An interval between the multiple sheet units 162 is used for ventilation, to dissipate heat of the RRU 10.

As shown in FIG. 6, the air deflection structure 14 is surrounded by the heat-dissipation fins 16, an air deflection cavity 13 is enclosed by the multiple heat-dissipation fins 16 and the remote radio main body 11 jointly, and the air deflection structure 14 can deflect the airflow that enters the air deflection cavity 13 to the heat-dissipation fins 16 smoothly, evenly, and in a low-resistance manner. In an implementation manner, as shown in FIG. 6, the air deflection structure 14 includes an air deflection cover plate 142 and multiple air deflection pillars 144, where the multiple air deflection pillars 144 are saliently disposed on the remote radio main body 11 and are distributed inside the air deflection cavity 13, and the air deflection cover plate 142 is secured to the remote radio main body 11 and shields the air deflection cavity 13, the airflow enters the air deflection cavity 13, and then the airflow is distributed by the air deflection pillars 144 into the multiple heat-dissipation fins 16. The interval between the multiple sheet units 162 communicates with the air deflection cavity 13; and when entering the air deflection cavity 13, the airflow encounters the air deflection pillars 144, and when contacting the air deflection pillars 144, the airflow changes the direction, so that the airflow is accelerated to enter the interval between the multiple sheet units 162, thereby improving heat-dissipation efficiency. The air deflection pillars 144 further have an airflow equalization function, the multiple air deflection pillars 144 are distributed in N rows and M columns (N and M are both natural numbers, and their specific values are determined according to the size of the air deflection cavity 13 and the diameter of the air deflection pillar 144) inside the air deflection cavity 13, a distance between two adjacent rows or two adjacent columns of the air deflection pillars 144 may be determined according to the vertical distance between two adjacent sheet units 162, and the distance between the two adjacent rows or the two adjacent columns of the air deflection pillars 144 may be equal to the vertical distance between the two adjacent sheet units 162.

In a further design of the present disclosure, each of the air deflection pillars 144 is cylindrical, and is perpendicularly disposed between the remote radio main body 11 and the air deflection cover plate 142. The air deflection pillar 144 may also be designed to be in a pillared structure of which a cross section is in a triangular shape or a polygonal shape.

An end surface, which is away from the remote radio main body 11, of each of the air deflection pillars 144 is adhered to the air deflection cover plate 142, and the air deflection pillar 144 and the air deflection cover plate 142 each include a thermally conductive material, such as a metal material. A refrigeration pipe or a refrigerant fluid may also be disposed inside the air deflection pillar 144 and the air deflection cover plate 142, to improve an effect of heat dissipation for the RRU 10.

In another implementation manner, as shown in FIG. 8, FIG. 8 shows a schematic diagram of an air deflection structure 14 according to another implementation manner. The heat-dissipation fins 16 and the remote radio main body 11 jointly form a air deflection cavity 13, multiple air deflectors 146 are disposed inside the air deflection cavity 13 to replace the multiple air deflection pillars 144, multiple air deflection channels 147 are formed inside the air deflection cavity 13 by using the multiple air deflectors 146, and the airflow that enters the air deflection cavity 13 is directly deflected by the multiple air deflection channels 147 to the heat-dissipation fins 16. In this implementation manner, the multiple air deflectors 146 are in an arc sheet structure, the airflow hits arc surfaces of the air deflectors 146, and the arc surfaces change a direction of the airflow, so that the airflow flows to an interval between multiple sheet units 162 of the heat-dissipation fins 16. The air deflectors 146 can deflect the airflow that enters the air deflection cavity 13 to the heat-dissipation fins 16 smoothly, evenly, and in a low-resistance manner. Further, an end surface, which is away from the remote radio main body 11, of each of the air deflectors 146 is adhered to the air deflection cover plate 142, and the multiple air deflectors 146 include thermally conductive materials or refrigeration materials are filled inside the air deflectors 146, so that the air deflectors 146 can dissipate heat during air deflection.

The air deflection structure is adjacent to the first air vent 12 of the back end plate 17.

The fan assemblies 20 of the present disclosure may provide a heat-dissipation airflow for at least two RRUs 10 at the same time, where the at least two RRUs 10 are disposed on a side of the fan assemblies 20, or the at least two RRUs 10 are distributed on two sides of the fan assemblies 20.

In summary, in a communications product 100 in the present disclosure, a fan assembly 20 is connected to a RRU 10 by using a ventilation part 34 that is disposed on a mounting assembly 30, and an air duct 346 of the ventilation part 34 is used as an air flowing channel between the fan assembly 20 and the RRU 10, so that the fan assembly 20 is closely adhered to the RRU 10; and when an airflow channel structure between the fan assembly 20 and the RRU 10 is disposed at the mounting assembly 30, space of the mounting assembly 30 is effectively used, so that a structure between the fan assembly 20 and the RRU 10 is simple, and the size is reduced. Therefore, the communications product 100 provided in the present disclosure can ensure a heat-dissipation capability of the communications product, and also can facilitate size miniaturization.

Figure 9:
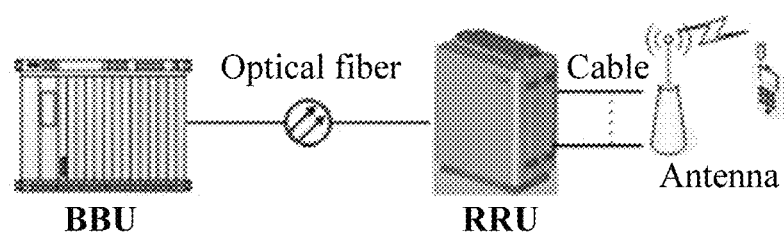
FIG. 9 is a schematic diagram of a base station system according to the present disclosure.

Referring to FIG. 9, the present disclosure further provides a base station system, including an equipment room and an antenna, where a building baseband unit (BBU) is disposed inside the equipment room, and the base station system further includes the communications product 100, where the RRU 10 of the communications product 100 is connected to the building baseband unit by using an optical fiber, the holder is close to the antenna, the RRU is close to the antenna and is mounted to the holder, and the RRU 10 is electrically connected to the antenna by using a coaxial cable and a power splitter.

The foregoing descriptions are exemplary implementation manners of the present disclosure. It should be noted that a person of ordinary skill in the art may make improvements and modifications without departing from the principle of the present disclosure, and these improvements and modifications shall fall within the protection scope of the present disclosure.

What is claimed is:

1. A communications product, wherein the communications product comprises:
   at least one remote radio unit comprising:
      a front end plate;
      a back end plate;
      a remote radio main body, wherein the remote radio main body is connected between the front end plate and the back end plate; and
      multiple heat-dissipation fins, wherein the multiple heat-dissipation fins are located between the from end plate and the back end plate and saliently disposed on a side of the remote radio main body, and;
   a fan assembly that is independent of the at least one remote radio unit, wherein the fan assembly is arranged opposite to one side of the remote radio main body with the heat-dissipation fins, and wherein the fan assembly is disposed side by side with the at least one remote radio unit; and
   an air duct that is disposed between the fan assembly and the remote radio unit, wherein an airflow passes, from the fan assembly, through the air duct, and arrives at the at least one remote radio unit to dissipate heat of the at least one remote radio unit.

2. The communications product according to claim 1, wherein the communications product further comprises a mounting assembly, wherein the mounting assembly is located at a side of the back end plate of the remote radio unit, wherein the mounting assembly comprises:
   a securing part, wherein the securing part is securely connected to the remote radio unit and the fan assembly; and
   a ventilation part securely connected to the securing part, wherein the air duct is formed inside the ventilation part, wherein the ventilation part comprises at least two openings, wherein the at least two openings correspond one-to-one to the at least one remote radio unit and the fan assembly, and wherein the at least two openings are respectively connected to a first air vent and a second air vent, wherein the first air vent is disposed on the back end plate of the remote radio unit, and wherein the second air vent is disposed on a surface which faces the mounting assembly of the fan assembly.

3. The communications product according to claim 2, wherein the fan assembly comprises:
   a front end surface; and
   a back end surface, wherein the second air vent is disposed on the back end surface, wherein multiple ventilation openings are distributed on the front end surface, and wherein the airflow forms convection inside the fan assembly through the ventilation openings and the second air vent.

4. The communications product according to claim 3, wherein the front end surface is coplanar with the front end plate of the remote radio unit, and wherein the back end surface is coplanar with the back end plate of the remote radio unit.

5. The communications product according to claim 2, wherein the ventilation part is located below the securing part or above the securing part.

6. The communications product according to claim 5, wherein the securing part comprises at least two sub-securing parts that are mutually spliced into a single-row structure, wherein the ventilation part comprises at least two sub-ventilation parts that are mutually spliced into a single-row structure, wherein the at least two sub-securing parts and the at least two sub-ventilation parts correspond one-to-one to each other to jointly form a double-row structure, wherein the at least two sub-ventilation parts internally communicate with each other, and wherein the at least two openings are respectively disposed on the at least two sub-ventilation parts.

7. The communications product according to claim 2, wherein the multiple heat-dissipation fins are distributed on two sides of the remote radio main body, and wherein a connection of the first air vent and the at least two openings makes the air duct communicate with the multiple heat-dissipation fins on the two sides of the remote radio main body.

8. The communications product according to claim 2, wherein there are multiple remote radio units, and wherein the fan assembly is located on a side of the multiple remote radio units or located between two of the multiple remote radio units.

9. The communications product according to claim 2, wherein the remote radio unit and the fan assembly are superimposed over each other to form two rows of communications components, wherein the mounting assembly is located between the two rows of communications components, and wherein the two rows of communications components share the air duct.

10. The communications product according to claim 9, wherein the back end plate of the remote radio unit in one row of the two rows of communications components faces the back end plate of the remote radio unit in the other row of the two rows of communications components.

11. The communications product according to claim 10, wherein the air duct is a straight channel, wherein the at least two openings are distributed on two sides of the air duct, wherein one or more openings located on one side of the air duct communicate with one row of the two rows of communications components, and wherein one or more openings located on the other side of the air duct communicate with the other row of the two rows of communications components.

12. The communications product according to claim 1, wherein the remote radio unit further comprises an air deflection structure, wherein the air deflection structure communicates with the air duct, wherein the air deflection structure is surrounded by the heat-dissipation fins, and wherein the airflow from the air duct passes through the air deflection structure and then is transferred to the multiple heat-dissipation fins.

13. The communications product according to claim 12, wherein the air deflection structure comprises:
   an air deflection cover plate; and multiple air deflection pillars, wherein an air deflection cavity is enclosed jointly by the multiple heat-dissipation fins and the remote radio main body, wherein the multiple air deflection pillars extend from a side of the remote radio main body, and are distributed inside the air deflection cavity, wherein the air deflection cover plate covers the top of the multiple air deflection pillars and shields the air deflection cavity, and wherein the airflow enters the air deflection cavity, and is distributed by the air deflection pillars into the multiple heat-dissipation fins.

14. The communications product according to claim 12, wherein the multiple heat-dissipation fins and the remote radio main body jointly form a receptacle, wherein the air deflection structure comprises:
- an air deflection cover plate, wherein the air deflection cover plate is secured to the remote radio main body and shields the receptacle; and
- multiple air deflectors, wherein multiple air deflection channels are formed inside the receptacle by using the multiple air deflectors, and wherein the airflow enters the receptacle and is distributed by the air deflection channels between the multiple air deflectors into the multiple heat-dissipation fins.

15. The communications product according to claim 12, wherein the air deflection structure is adjacent to the back end plate.

16. A base station system, comprising:
an equipment room; and
an antenna, wherein a building baseband unit is disposed inside the equipment room, wherein the base station system further comprises a communications product, wherein the communications product comprises:
at least one remote radio unit comprising:
- a front end plate;
- a back end plate;
- a remote radio main body, wherein the remote radio main body is connected between the front end plate and the back end plate; and
- multiple heat-dissipation fins, wherein the multiple heat-dissipation fins are located between the front end plate and the back end plate and saliently disposed on a side of the remote radio main body, wherein the at least one remote radio unit is connected to the building baseband unit by using an optical fiber, and wherein the remote radio unit is electrically connected to the antenna; and
a fan assembly that is independent of the at least one remote radio unit and is disposed side by side with the at least one remote radio unit, wherein the fan assembly is arranged opposite to one side of the remote radio main body with the heat-dissipation fins, wherein an air duct is disposed between the fan assembly and the remote radio unit, and wherein an airflow passes, from the fan assembly, through the air duct, and arrives at the at least one remote radio unit to dissipate heat of the at least one remote radio unit.

17. The base station system according to claim 16, wherein the communications product further comprises a mounting assembly, wherein the mounting assembly is located at a side of the back end plate of the remote radio unit, wherein the mounting assembly comprises:
- a securing part, wherein the securing part is securely connected to the remote radio unit and the fan assembly; and
- a ventilation part that is securely connected to the securing part, wherein the air duct is formed inside the ventilation part, wherein the ventilation part comprises at least two openings, wherein the at least two openings correspond one-to-one to the at least one remote radio unit and the fan assembly, wherein the at least two openings are respectively connected to a first air vent and a second air vent, wherein the first air vent is disposed on the back end plate of the remote radio unit, wherein the second air vent is disposed on a surface which faces the mounting assembly of the fan assembly.

18. The base station system according to claim 17, wherein the fan assembly comprises:
- a front end surface, wherein multiple ventilation openings are distributed on the front end surface, and wherein the airflow forms convection inside the fan assembly through the multiple ventilation openings and the second air vent; and
- a back end surface, wherein the second air vent is disposed on the back end surface.

* * * * *